US009110102B2

(12) United States Patent
Kesler

(10) Patent No.: US 9,110,102 B2
(45) Date of Patent: Aug. 18, 2015

(54) ELECTRICAL TEST SWITCH

(71) Applicant: Schweitzer Engineering Laboratories, Inc., Pullman, WA (US)

(72) Inventor: James R Kesler, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 236 days.

(21) Appl. No.: 13/789,370

(22) Filed: Mar. 7, 2013

(65) Prior Publication Data

US 2014/0253146 A1    Sep. 11, 2014

(51) Int. Cl.
*H01H 31/02* (2006.01)
*G01R 1/20* (2006.01)
*H01H 1/44* (2006.01)
*H01H 9/28* (2006.01)
*H01H 71/02* (2006.01)

(52) U.S. Cl.
CPC ........ *G01R 1/206* (2013.01); *H01H 1/44* (2013.01); *H01H 9/286* (2013.01); *H01H 71/0271* (2013.01)

(58) Field of Classification Search
CPC .... G01R 31/21; G01R 31/26; G01R 1/06788; H01R 210/30; H01R 13/70; H01R 13/703; H01R 13/7036
USPC ................................................. 324/500, 555
See application file for complete search history.

(56) References Cited

U.S. PATENT DOCUMENTS

| 4,615,533 | A | * | 10/1986 | Sewell ........................ 280/43.12 |
| 5,581,130 | A | * | 12/1996 | Boucheron ................... 307/10.1 |
| 5,691,871 | A | * | 11/1997 | Innes .............................. 361/96 |
| 5,949,247 | A | * | 9/1999 | Lima et al. ............... 324/765.01 |
| 7,026,822 | B1 | * | 4/2006 | Bald et al. ...................... 324/415 |
| 7,271,357 | B2 | | 9/2007 | Ostmeier |
| 7,302,752 | B2 | | 12/2007 | Ball |
| D558,687 | S | | 1/2008 | Ball |
| 7,372,692 | B2 | * | 5/2008 | Ranta et al. .................... 361/641 |
| D583,334 | S | | 12/2008 | Ball |
| D593,961 | S | | 6/2009 | Ball |
| D595,662 | S | | 7/2009 | Ball |
| 7,563,999 | B2 | * | 7/2009 | Ball et al. ...................... 200/293 |
| D611,004 | S | | 3/2010 | Nutting |
| D621,793 | S | | 8/2010 | Nutting |

(Continued)

FOREIGN PATENT DOCUMENTS

WO    2010101923    9/2010
WO    2011028822    3/2011

*Primary Examiner* — Arleen M Vazquez
*Assistant Examiner* — Dominic Hawkins
(74) *Attorney, Agent, or Firm* — Matthew D. Thayne; Richard M. Edge

(57) ABSTRACT

Disclosed herein are various embodiments of electrical test switches. According to one embodiment, a test switch may include a switch lever, a test port configured to directly couple to a standard connector, a relay port, a field port, and an insulated frame configured to electrically insulate at least some electrically conductive portions of the test port, the relay connector, and the field connector from contact by a user. A user may actuate the switch lever in order to reconfigure the electrical test switch from a first configuration to a second configuration. In the first configuration, the test port contact is electrically isolated from the relay connector and the field connector is electrically connected to the relay connector. In the second configuration, the test port contact is electrically connected to the relay connector and the relay connector is electrically isolated from the field connector.

20 Claims, 11 Drawing Sheets

(56) References Cited

U.S. PATENT DOCUMENTS

| | | |
|---|---|---|
| 8,007,312 B2 | 8/2011 | Bower |
| 8,333,082 B2 * | 12/2012 | Robinson ................ 62/150 |
| 8,400,161 B2 | 3/2013 | Belhumeur |
| 2004/0124864 A1 * | 7/2004 | Feld et al. ............... 324/755 |
| 2005/0024062 A1 * | 2/2005 | Washizu ................ 324/500 |
| 2005/0250376 A1 | 11/2005 | Ostmeier |
| 2006/0059681 A1 | 3/2006 | Ball |
| 2008/0011589 A1 * | 1/2008 | Ball et al. ................ 200/5 A |
| 2008/0055164 A1 * | 3/2008 | Zhang et al. ............ 343/702 |
| 2008/0237193 A1 * | 10/2008 | Bogdon et al. .......... 218/146 |
| 2010/0007312 A1 * | 1/2010 | Petkov ..................... 322/44 |
| 2010/0133078 A1 * | 6/2010 | Majewski et al. ....... 200/293 |
| 2011/0028031 A1 * | 2/2011 | Bower et al. ............ 439/540.1 |
| 2011/0056819 A1 * | 3/2011 | Bower et al. ............ 200/5 B |
| 2011/0291667 A1 | 12/2011 | Belhumeur |
| 2012/0091932 A1 * | 4/2012 | Rottmerhusen .......... 318/381 |
| 2012/0181154 A1 * | 7/2012 | Ho et al. ................ 200/293 |

* cited by examiner

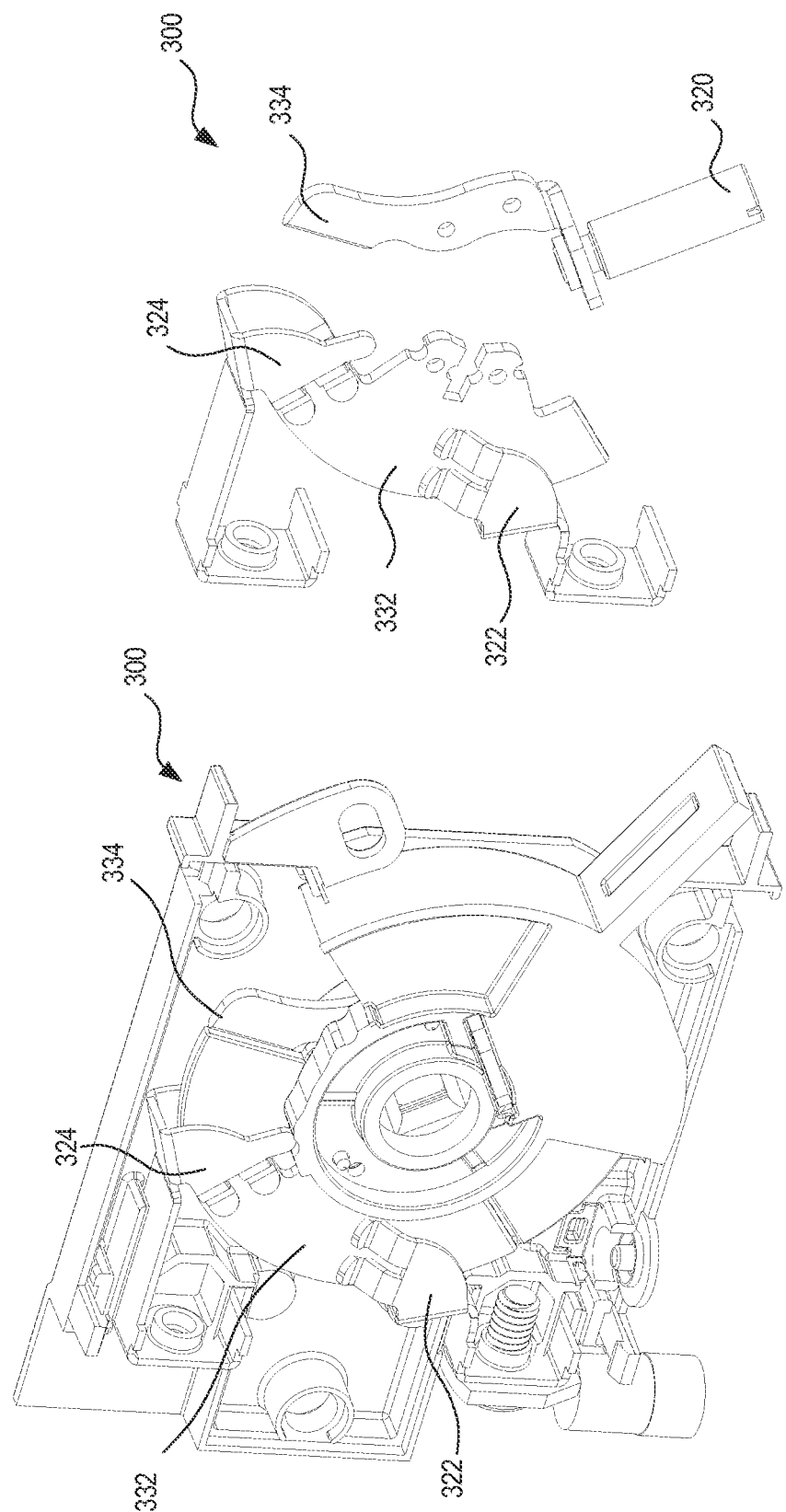

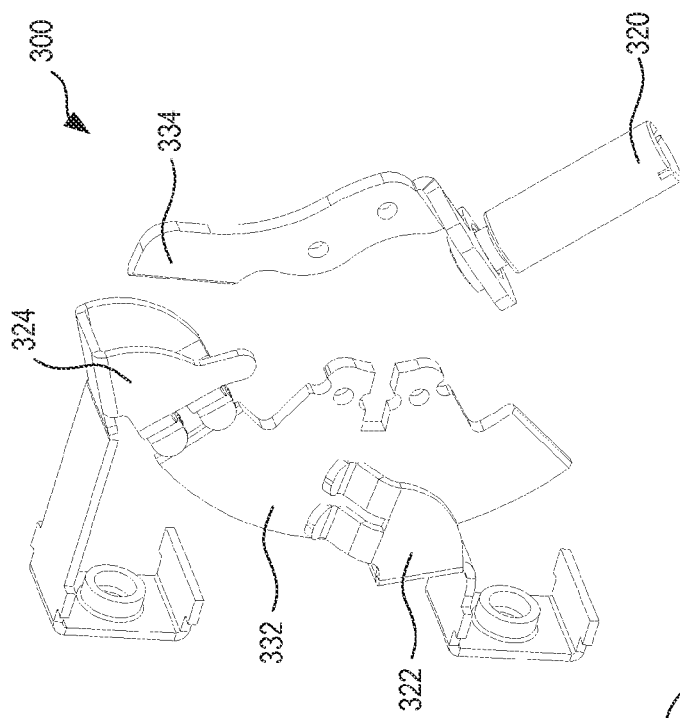
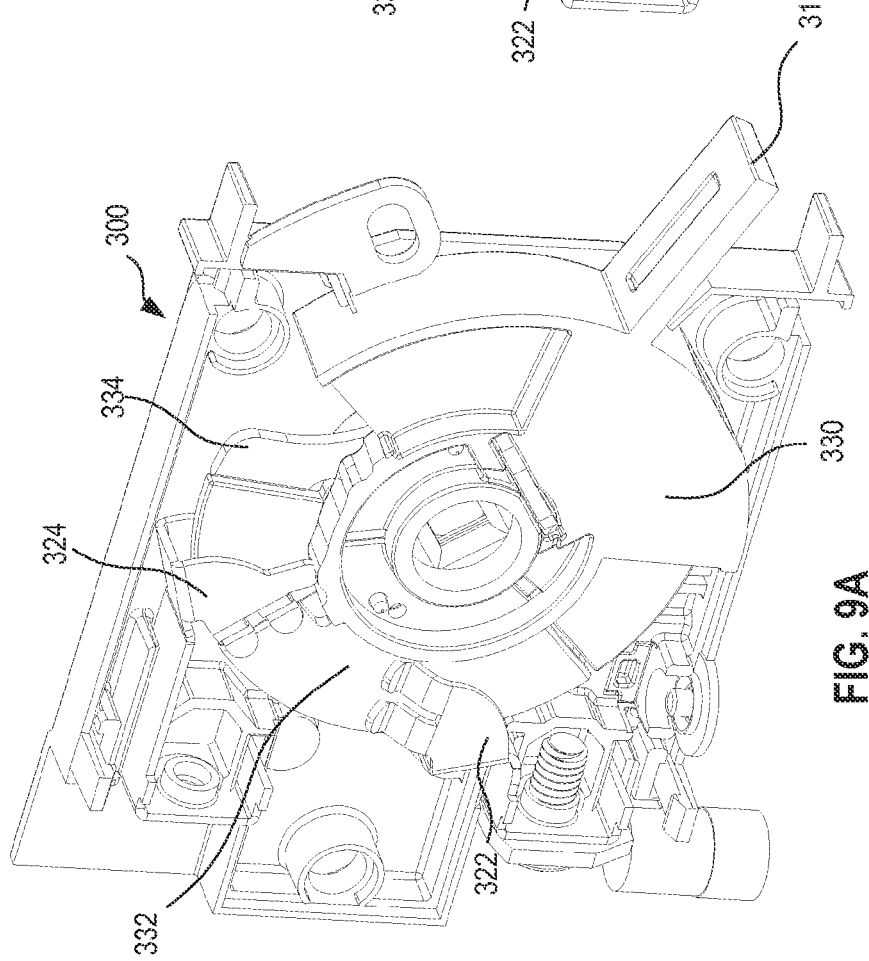

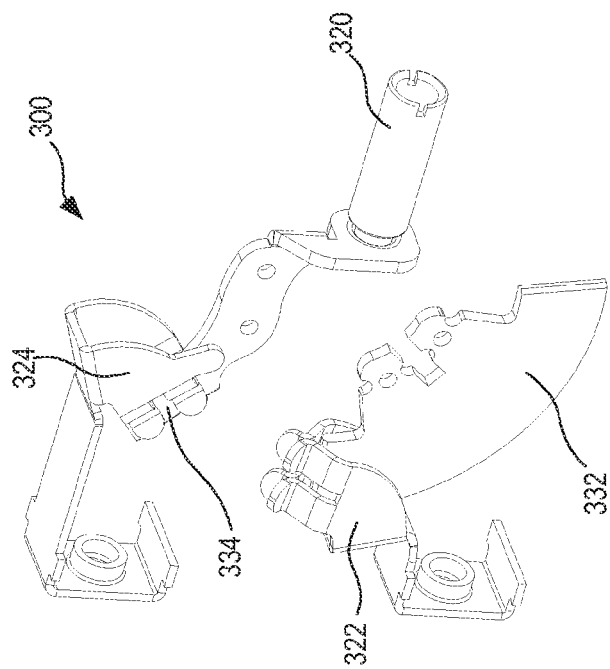
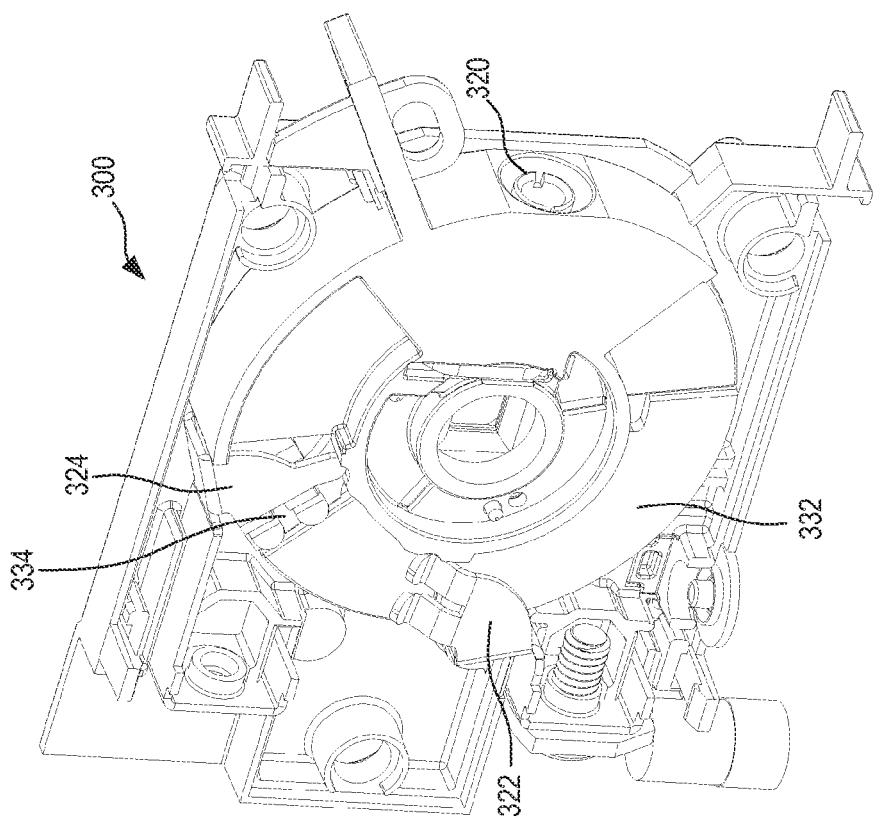

ELECTRICAL TEST SWITCH

BRIEF DESCRIPTION OF THE DRAWINGS

Non-limiting and non-exhaustive embodiments of the disclosure are described, including various embodiments of the disclosure with reference to the figures, in which:

FIG. 8A is a perspective view of a test switch in an operating configuration, according to one embodiment.

FIG. 8B is a perspective view of the electrically-conductive components of the electrical test switch of FIG. 8A, according to one embodiment.

FIG. 9A is a perspective view of the electrical test switch of FIG. 8A in an open configuration, according to one embodiment.

FIG. 9B is a perspective view of the electrically-conductive components of the electrical test switch of FIG. 9A, according to one embodiment.

FIG. 10A is a perspective view of the electrical test switch of FIG. 8A in a testing configuration, according to one embodiment.

FIG. 10B is a perspective view of the electrically-conductive components of the electrical test switch of FIG. 10A, according to one embodiment.

DETAILED DESCRIPTION

Figure 1A:
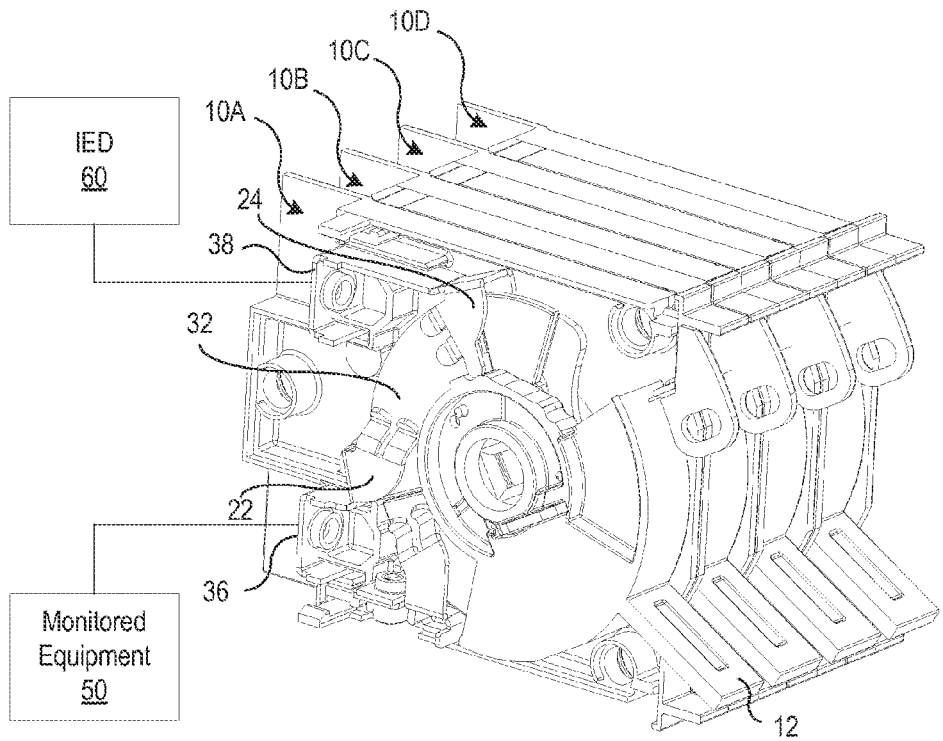
FIG. 1A is a block diagram of an electrical test switch in an operating configuration, in which the test switch creates an electrical path between a piece of monitored equipment and an intelligent electronic device, according to one embodiment.

Disclosed herein are various embodiments of electrical test switches or test blocks for use in commissioning, troubleshooting, maintaining, and testing electrical circuits and systems in an electrical power generation and distribution system. Electrical power generation and distribution systems are designed to generate, transmit, and distribute electrical energy to loads. Electrical power generation and distribution systems may include equipment, such as electrical generators, electrical motors, power transformers, power transmission and distribution lines, circuit breakers, switches, buses, transmission lines, voltage regulators, capacitor banks, and the like. Such equipment may be monitored, controlled, automated, and/or protected using intelligent electronic devices ("IEDs") that receive electric power system information from the monitored equipment, make decisions based on the information, and provide monitoring, control, protection, and/or automation outputs to the monitored equipment. Provided above is an exemplary, non-exhaustive list of equipment in an electrical power generation and distribution system that may be referred to herein as monitored equipment. The term monitored equipment, as used herein, refers to any device that may be monitored, controlled, and/or automated using an IED.

In some embodiments, an IED may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communication processors, computing platforms, programmable logic controllers ("PLCs"), programmable automation controllers, input and output modules, governors, exciters, statcom controllers, SVC controllers, OLTC controllers, and the like. Further, in some embodiments, IEDs may be communicatively connected via a network that includes, for example, multiplexers, routers, hubs, gateways, firewalls, and/or switches to facilitate communications on the networks, each of which may also function as an IED. Networking and communication devices may also be integrated into an IED and/or be in communication with an IED. As used herein, an IED may include a single discrete IED or a system of multiple IEDs operating together.

The embodiments of the disclosure will be best understood by reference to the drawings. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor do the steps need to be executed only once, unless otherwise specified.

In some cases, well-known features, structures, or operations are not shown or described in detail. Furthermore, the described features, structures, or operations may be combined in any suitable manner in one or more embodiments. It will also be readily understood that the components of the embodiments, as generally described and illustrated in the figures herein, could be arranged and designed in a wide variety of different configurations.

A test block is a device that may be utilized in connection with an electrical power generation and distribution system during commissioning, and in order to troubleshoot, perform maintenance, and conduct testing of such systems after they have been commissioned. A test block may comprise a plurality of test switches. Each test switch may be individually connected between a piece of monitored equipment and an IED, as illustrated in FIGS. 1A-1D.

Figure 1B:
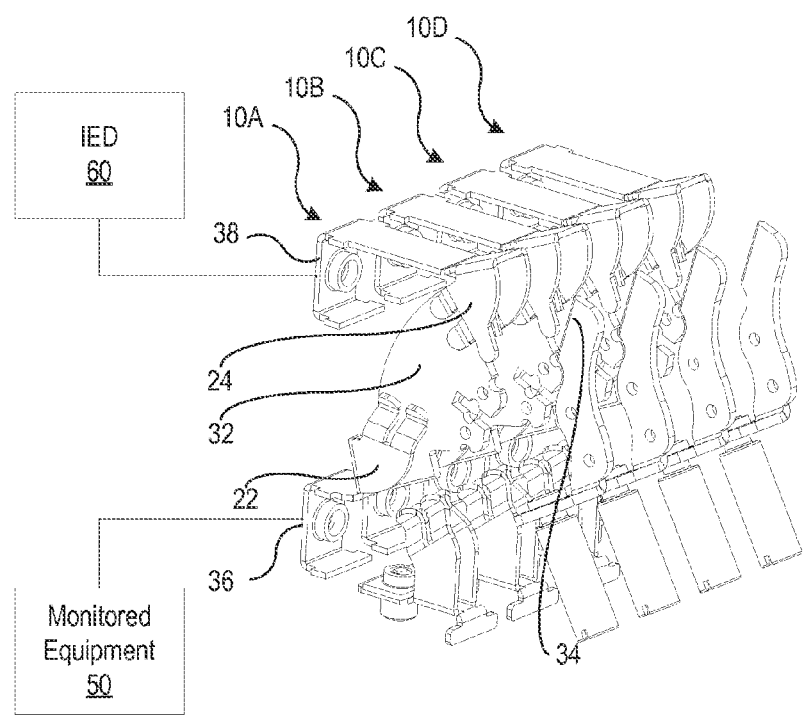
FIG. 1B is a block diagram of the electrically-conductive components of the electrical test switch of FIG. 1A, according to one embodiment.

FIGS. 1A and 1B illustrate perspective views of a plurality of test switches 10A-10D in an operating configuration. FIG. 1B illustrates only the electrically conductive portions of the test switches 10A-10D shown in FIG. 1A. The structures shown in FIG. 1A that are omitted from FIG. 1B may be formed of an electrically insulating material, such as plastic.

The electrically insulating components may shield the electrically conductive components and may help to prevent a user from inadvertently contacting the electrically conductive components in test switches 10A-10D. Accordingly, test switches 10A-10D may offer a measure of improved safety over test switches having exposed electrical conductors.

Test switch 10A is disposed in an electrical path between a piece of monitored equipment 50 and an IED 60. The electrical path between monitored equipment 50 and IED 60 may allow for data relating to monitored equipment 50 to be transmitted to IED 60. Although not shown in FIG. 1A, test switches 10B-10D may similarly be disposed in electrical paths between other pieces of monitored equipment and other IEDs. According to the illustrated embodiment, IED 60 is in electrical communication with a relay port 38, and monitored equipment 50 is in electrical communication with a field port 36. Further, relay port 38 is in electrical communication with a relay connector 24, and field port 36 is in electrical communication with a field connector 22. In the operating configuration shown in FIG. 1A, a main contact 32 creates an electrical path between relay connector 24 and field connector 22. The position of the main contact 32 may be changed by actuation of switch levers 12. As is shown in FIGS. 1C and 1D, actuation of switch lever 12 causes main contact 32 to rotate away from relay connector 24 and causes test port contact 34 to come into contact with relay connector 24.

Figure 1C:
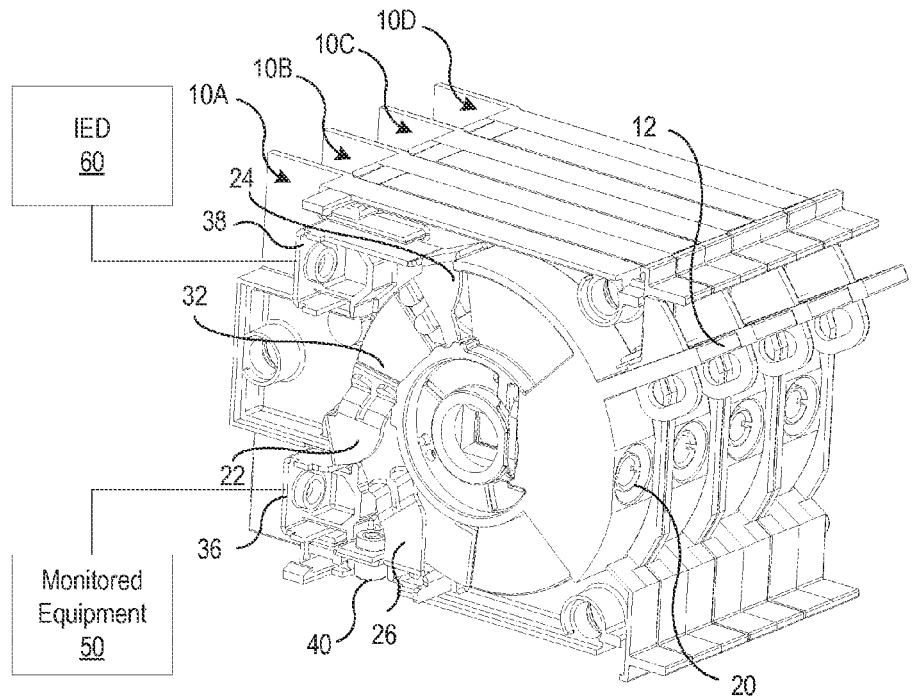
FIG. 1C is a block diagram of an electrical test switch in a testing configuration, in which the test switch creates an electrical path between a test port and an IED, according to one embodiment.
Figure 1D:
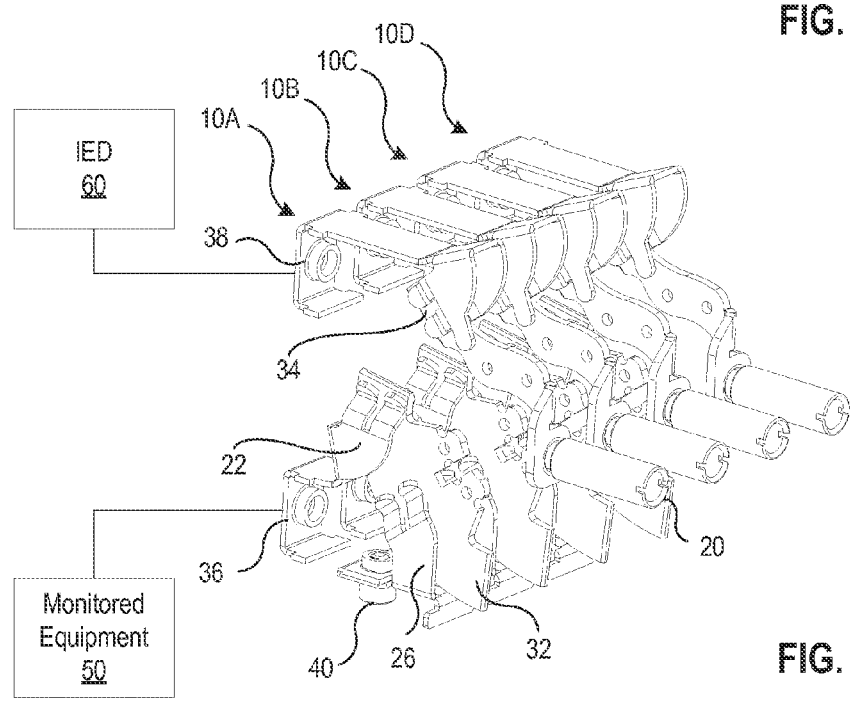
FIG. 1D is a block diagram of the electrically-conductive components of the electrical test switch of FIG. 1C, according to one embodiment.

FIGS. 1C and 1D illustrate perspective views of the plurality of test switches 10A-10D in a testing configuration. Test port 20 is exposed in the testing configuration. Test port 20 may allow a user to connect a test device (not shown) to IED 60 without the need for disconnecting monitored equipment 50 from field port 36. A user may connect to a test device to test port 20 during commissioning, and in order to troubleshoot, perform maintenance, and conduct testing of such systems after they have been commissioned. As is best illustrated in FIG. 1D, in the testing configuration main contact 32 creates an electrical connection between a shorting connector 26 and field connector 22. Shorting connector 26 may be connected to ground port 40.

In the testing configuration, a test port contact 34 may create an electrical path between test port 20 and relay connector 24. Accordingly, a test signal introduced to test port 20 may pass through to IED 60 as if it originated from monitored equipment 50. A test device (not shown) may generate a variety of test conditions, which if were associated with actual conditions of monitored equipment 50 would cause IED 60 to take one or more protective actions. The conditions which may trigger protective action vary based upon the type of monitored equipment. In one example, a test device may simulate a surge of current. The simulated surge of current may prompt IED to take protective action (e.g., actuating a breaker to disrupt the surge of current).

Figure 2:
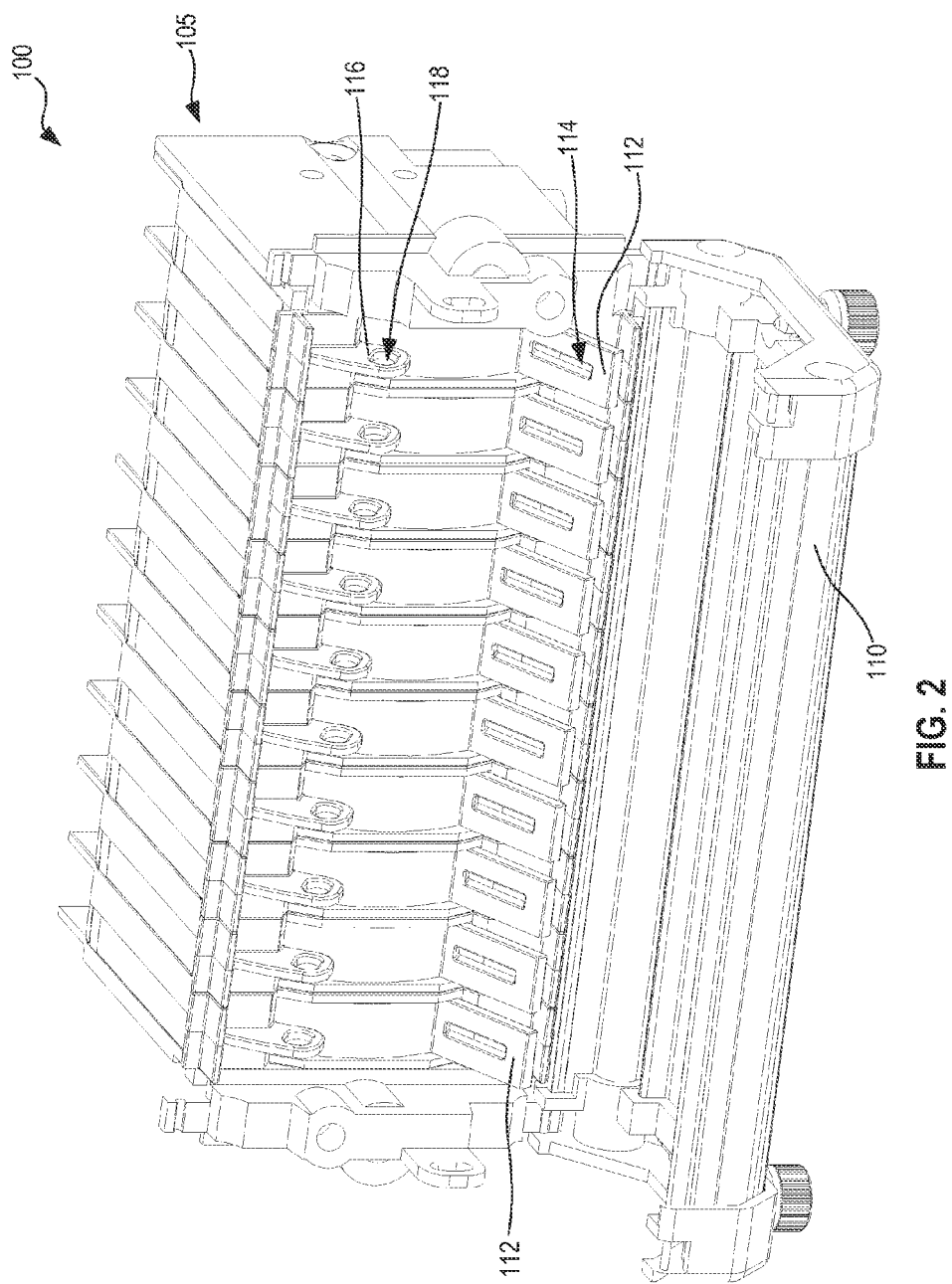
FIG. 2 is a perspective view of an embodiment of an electrical test block in an operational configuration, according to one embodiment.
Figure 3:
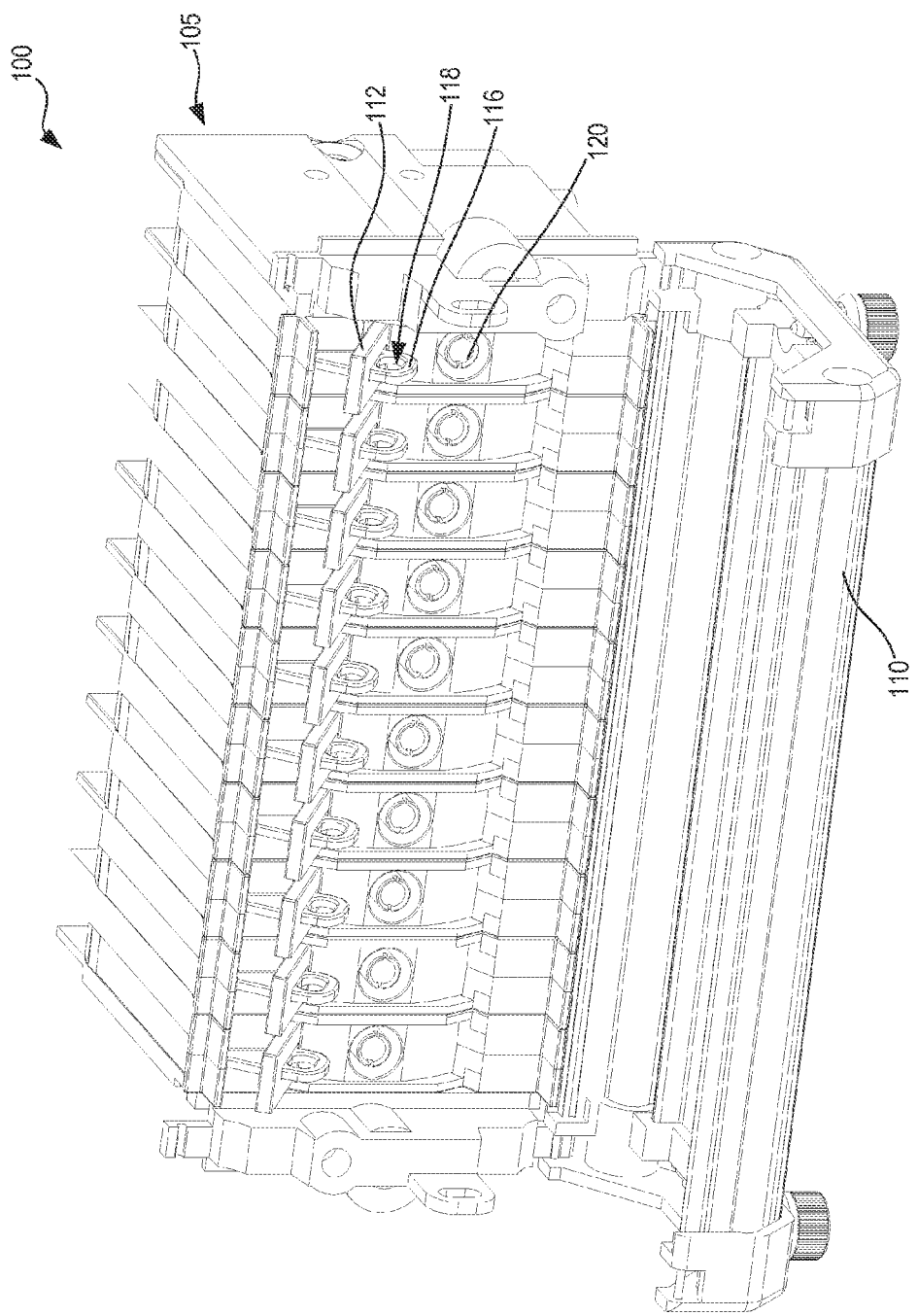
FIG. 3 illustrates the electrical test block of FIG. 2 in a testing configuration, according to one embodiment.

FIGS. 2 and 3 depict a test block 100 having ten electrical test switches. As shown in these FIGS., test block 100 comprises a housing 105, a front cover 110, a plurality of switch levers 112, and a corresponding plurality of lockout structures 116. Front cover 110 is shown in an open position in FIGS. 2 and 3 to expose switch levers 112, and potentially test ports 120 (as shown in FIG. 3), as described below. Front cover 110 may be rotated into a closed position to prevent access to switch levers 112 and test ports 120. According to other embodiments, front cover 110 may be slid, snapped, or otherwise secured into a closed position. Each of switch levers 112 may include openings comprising slots 114 through which the lockout structures 116 are configured to be received when the switch levers are moved from an operational configuration, as shown in FIG. 2, to a testing configuration, as shown in FIG. 3.

Lockout structures 116 may also comprise lock openings 118 that are configured to engage a lock (not shown) for physically preventing the electrical test block from being disengaged from a current electrical configuration. More particularly, lock openings 118, once engaged with one or more locks, may be used to keep test block 100 in a testing configuration. Alternative embodiments may, however, be configured to keep test block 100 in an operational configuration or, otherwise stated, to prevent test block 100 from being inadvertently moved to a testing configuration. Further, lock openings 118 may allow for other items, such as zip-ties, to be placed through lock openings 118 in order to secure test block 100 in the testing configuration.

In the operating configuration shown in FIG. 2, the front or user-facing side of test block 100 may be free from electrically conductive components. Accordingly, there is little or no risk of a user coming into contact with an energized electrical conductor and suffering an electrical shock. As illustrated in connection with FIGS. 1A-1D, electrical connections with monitored equipment and IEDs may be disposed on the back side of test block 100 in order to further reduce the likelihood of a user receiving an inadvertent electrical shock.

FIG. 3 illustrates the test block 100 of FIG. 2 in a testing configuration. In the testing configuration shown in FIG. 3, test ports 120 can be seen. Test ports 120 may be used to facilitate the commissioning stage of an electrical substation system, and may further be used to troubleshoot, perform maintenance, and conduct testing of such systems after they have been commissioned. Test ports 120 may be embodied as standard electrical connectors (e.g., a sheathed banana connector, an unsheathed banana connector, a BNC connector, shielded banana plugs, a binding post, etc.). In other words, test ports 120 may be configured to connect directly with standard electrical connectors (not shown) without an intermediary adaptor or connector device positioned between the test port 120 and the standard electrical connector.

As illustrated in FIG. 3, test ports 120 are recessed within in the individual electrical switches constituting test block 100. According to the illustrated embodiment, a sheathed banana connector may be used to connect a test device (not shown) to one or more of test ports 120. The use of recessed test ports 120 and sheathed banana connectors may further reduce the risk of a user suffering an inadvertent electrical shock because electrical conductors associated with a test device are shielded or recessed, and thus, are unlikely to be inadvertently contacted by a user.

Figure 4:
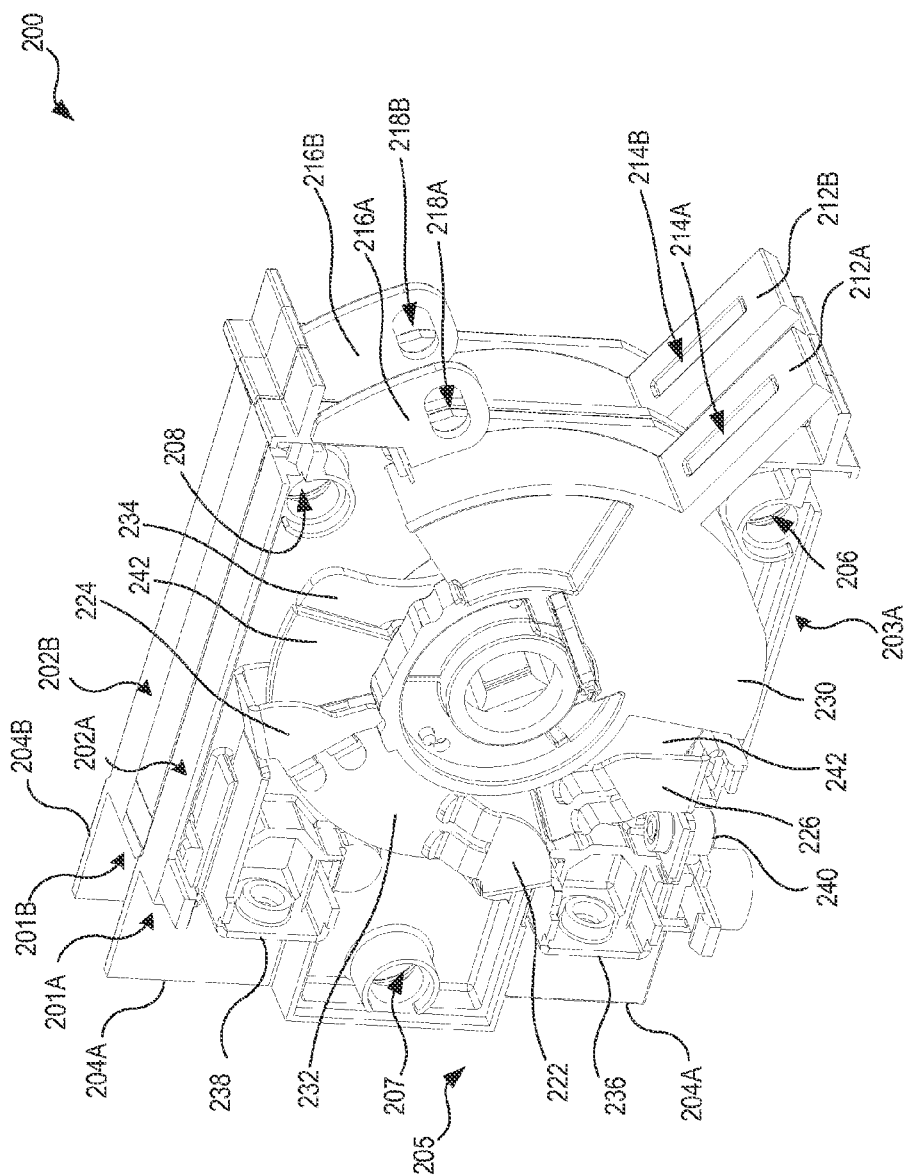
FIG. 4 is a perspective view illustrating certain electrical connections of an electrical test block in an operational configuration, according to one embodiment.

FIGS. 4-7 depict various positions or configurations of one embodiment of a test block 200 comprising two test switches 201A and 201B. FIG. 4 illustrates that certain portions of a housing, such as housing 105 shown in FIGS. 2-3, may be incorporated into individual test switches, such as test switches 201A and 201B. Specifically, test switches 201A and 201B may each include a top surface 202A and 202B a bottom surface 203A. For purposes of illustrating the internal components of test switch 201A, a section of top surface 202A is omitted; however, as may be appreciated, as a plurality of test switches are stacked together, the top and bottom surfaces create a housing, such as housing 105 shown in FIGS. 2-3. Further, the rear of test switches 201A and 201B may comprise a plurality of dividers 204A and 204B that may maintain a separation between wires connected to each switch. The front, or user-facing side, of test switches 201A and 201B may include switch levers 212A and 212B, and lockout structures 216A and 216B. Switch levers 212A and 212B may each comprise a slot 214A and 214B, respectively, for receipt of a lockout structures 216A and 216B therethrough. In addition, lockout structures 216A and 216B may each comprise a lock opening 218 for engagement with a lock (not shown) for physically preventing the electrical test block from being disengaged from a current electrical configuration.

While the embodiment illustrated in FIG. 4 shows only two test switches, any number of electrical test switches may be combined together as desired to form a test block that meets a user's needs. Test switches 201A and 201B each comprise locking features that are configured to join a desired number of test switches into a test block. More particularly, each of test switches 201A and 201B may comprise openings 206, 207, and 208 formed within a frame 205. Openings 206, 207, and 208 are configured to receive a connecting rod therethrough (not shown) to create a test block including a desired number of test switches. Openings 206, 207, and 208 may also be threaded or partially threaded, and may receive a threaded connection rod to further facilitate stacking of individual electrical test switches. Additional locking features, such as a cap and/or nut attached to the end of a connection rod, may also be provided to keep the connection rod in place.

Test switch 201A comprises a field port 236, a relay port 238, a test port (ref. no. 220 in FIG. 6) and a ground port 240, which may be selectively electrically connected by actuation of switch lever 212A. Each of field port 236, relay port 238, and ground port 240 are associated with a connector disposed within test switch 201A. Specifically, field port 236 is associated with field connector 222, relay port 238 is associated with relay connector 224, and ground port 240 is associated with shorting connector 226. Each of connectors 222, 224, and 226 may include two electrical contact fingers. The electrical contact fingers shown in the depicted embodiment may facilitate engagement with internal contacts (e.g., a main contact 232 and a test port contact 234.

Test block 200 also includes a rotor 230. Rotor 230 is attached to, and may be actuated by switch levers 212. Rotor 230 may also at least partially define a substantially circular track. The substantially circular track may comprise main contact 232 and test port contact 234. Further, electrically insulating portions 242 of rotor 230 may separate main contact 232 and test port contact 234. When one or both of switch levers 212 are moved, rotor 230 moves, which, in turn, causes the substantially circular track to rotate, along with main contact 232 and test port contact 234. Test port contact 234 is electrically connected with test port 220 (ref. no. 220 in FIG. 7). As main contact 232 and test port contact 234 are moved in a circle on rotor 230, they may be configured to selectively connect and disconnect from particular connectors in a desired manner, as described in greater detail below.

Figure 5:
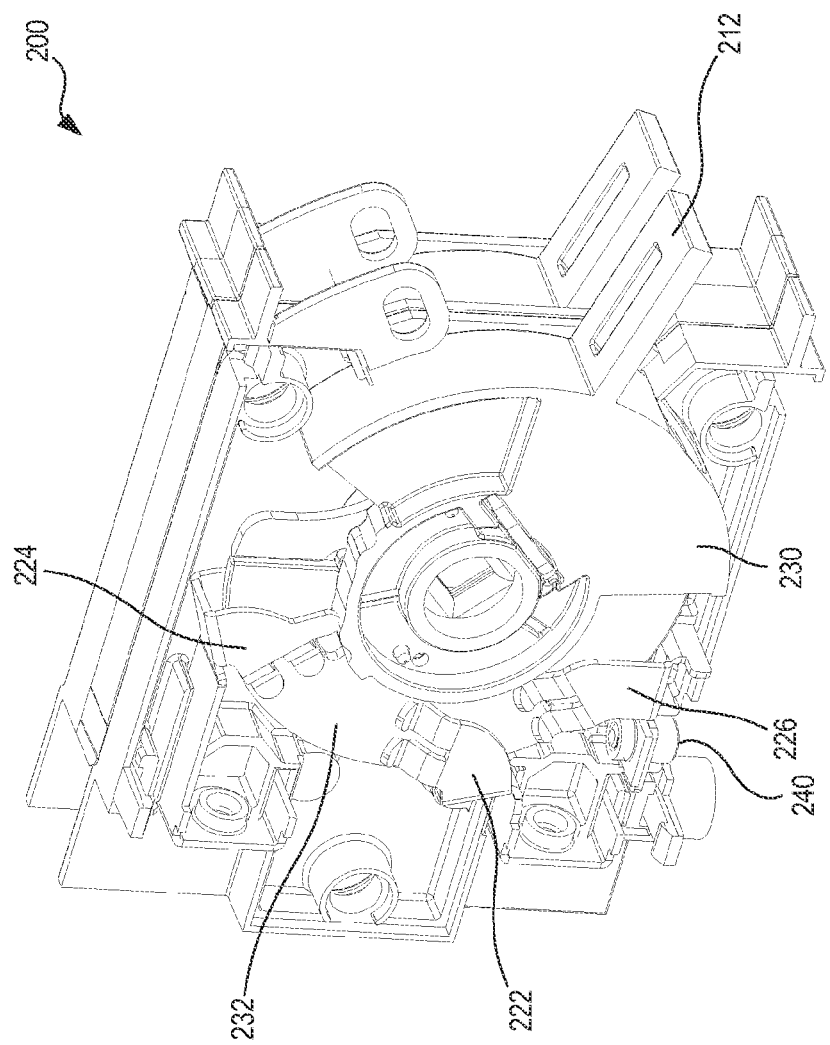
FIG. 5 is a perspective view illustrating certain electrical connections of electrical test block of FIG. 4 in a shorting configuration, according to one embodiment.

FIG. 5 depicts test block 200 in a shorting configuration. In this configuration, shorting connector 226, which is grounded via ground port 240 is electrically connected to field connector 222 via main contact 232. In some embodiments, relay connector 224 may also be connected to shorting connector 226 in the shorting configuration. Also, in other embodiments, as mentioned above, shorting connector 226 may be omitted. A shorting connector may typically be provided in embodiments of a test switch configured for use with a current transformer. The shorting configuration shown in FIG. 5 may be triggered by only a slight movement of switch lever 212.

Figure 6:
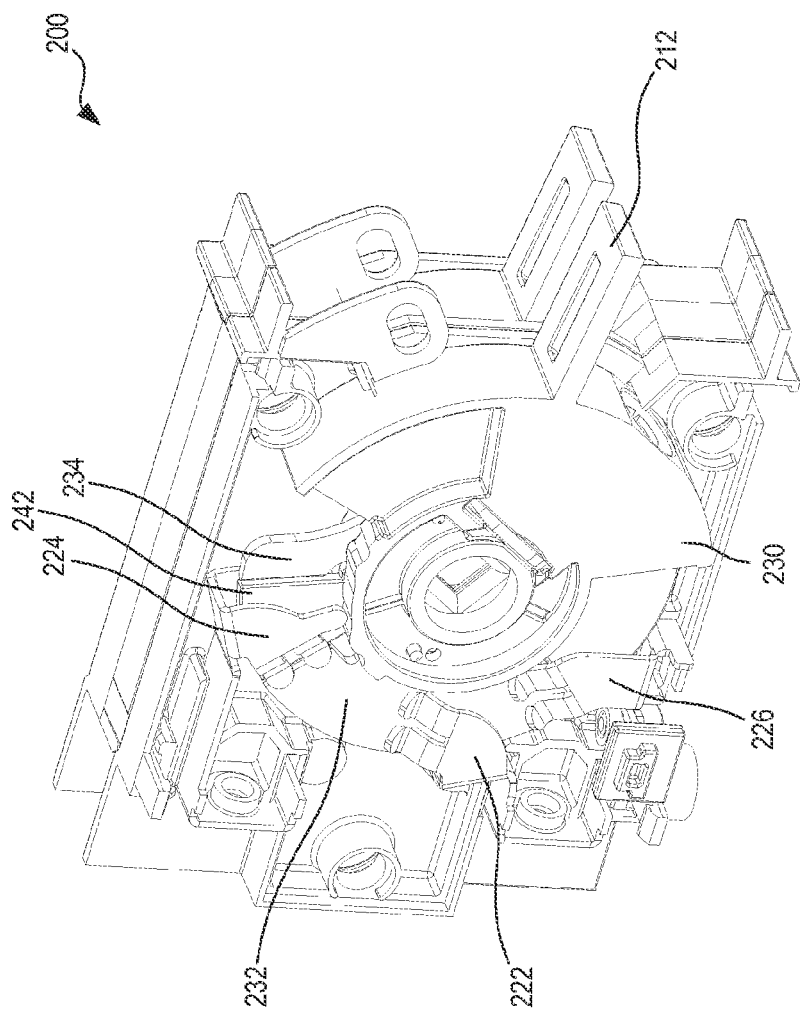
FIG. 6 is a perspective view of the electrical test block of FIG. 4 in an open configuration, according to one embodiment.

FIG. 6 depicts test block 200 in an open configuration. In this configuration, relay connector 224 has lost contact with main contact 232 such that relay connector 224 is no longer in electrical contact with field connector 222. Rather, field connector 222 may be in contact with an electrically insulating portion 242 of rotor 230. In this configuration, the test ports 220 (ref. no. 220 in FIG. 7) may be physically inaccessible (as well as electrically dead). However, in some embodiments, test ports may be partially, or wholly, accessible in this configuration, despite the fact that the test ports are not yet operational because relay connector 224 is not yet in contact with test port contact 234.

In some embodiments, test block 200 may be configured such that switch lever(s) reach any of the various intermediate positions/configurations, as described herein, as part of the natural movement of the switch lever from an operational configuration to a testing configuration. In other words, the open and/or shorting configurations may not be defined as a single, discrete physical configuration, but may instead comprise a range of locations, none of which need ever be stopped at, within which the movement from an operational configuration to a testing configuration takes place.

For example, the shorting and/or open configurations described above with respect to test block 200 may be reached at a physical location in between the location of switch lever 212 at the operational configuration and the location of switch lever 212 at the testing configuration (depicted in FIG. 7 and described below). In some such embodiments, the switch lever may be configured such that one or more configurations are reached at substantially the midpoint of the position of switch lever 212 between a first configuration and a second configuration, such as at substantially the midpoint of the position of switch lever 212 between an operational configuration and a testing configuration.

Figure 7:
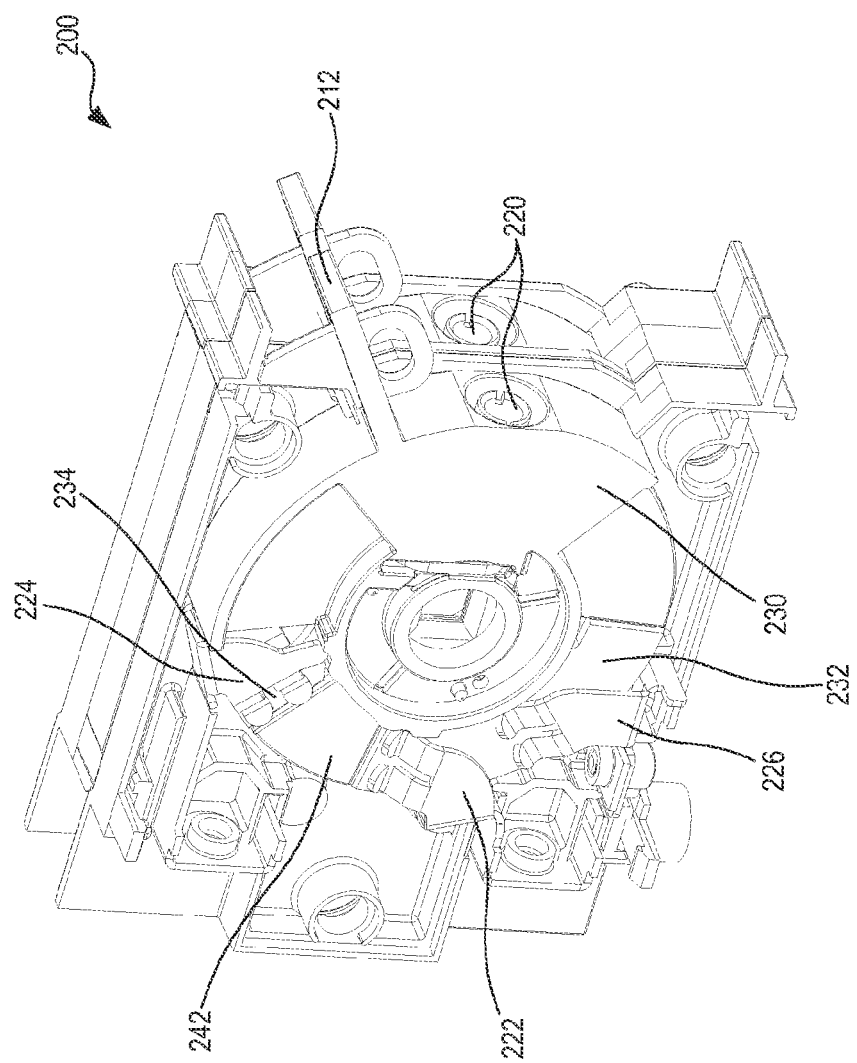
FIG. 7 is a perspective view of the electrical test block of FIG. 4 in a testing configuration, according to one embodiment.

FIG. 7 depicts test block 200 in a testing configuration. In this configuration, the field connector 222 remains shorted, due to the fact that both the field connector 222 and the shorting connector 226 are in contact with main contact 232. In this configuration, however, relay connector 224 has made contact with test port contact 234. In this configuration, test port(s) 220 are accessible and operational (since relay connector 224 has made contact with test port contact 234) for troubleshooting, maintenance, testing, etc. of equipment associated with a relay port.

FIGS. 8A, 8B, 9A, 9B, 10A, and 10B depict an embodiment of a test switch 300. Test switch 300 may be used be suitable for use in connection with a variety of types of monitored equipment other a current transformer. The embodiment illustrated in FIGS. 8A, 8B, 9A, 9B, 10A, and 10B does not include a shorting connector. FIGS. 8A, 9A, and 10A are perspective views of test switch 300 in an operating configuration, open configuration, and testing configuration, respectively. FIGS. 8B, 9B, and 10B depict the electrically-conductive components of test switch 300 in these previously mentioned configurations.

As mentioned above, FIGS. 8A and 8B depict test switch 300 in an operational configuration. In this configuration, both relay connector 324 and field connector 322 are in contact with main contact 332. Test port contact 334 is electrically disconnected from both relay connector 324 and field connector 322. Since test port contact 334 is electrically connected with test port 320, test port 320 is electrically dead or non-operational. It should be understood that test port contact 334 and test port 320 may comprise a single component or, alternatively, test port contact 334 may be a separate component from test port 320 that is electrically coupled to test port contact 334.

FIGS. 9A and 9B depict a test switch 300 in an open configuration. In this configuration, field connector 322 is still in contact with main contact 332, but relay connector 324 has been disconnected from main contact 332 by virtue of a switch lever 312 having been moved from an initial position to an intermediary position (which, as described above, need not be discrete). As with the previously described embodiments, switch lever 312 may be coupled with a rotor 330, which may be coupled with main contact 332 and test port contact 334, such that main contact 332 and test port contact 334 rotate or otherwise move in unison on a substantially circular track. In this configuration, relay connector 324 has been disconnected from field connector 322. However, test port contact 334 has not yet come into contact with relay connector 324, and thus test port 320 is still electrically dead.

According to other embodiments, however, relay connector 324 may remain in contact with main contact 332 in the open configuration. In addition, it should further be understood that some embodiments may be configured such that multiple units are stacked together to comprise a multi-pole test block. According to one embodiment, the "clocking" of one or more of the various contacts described herein may be offset from one or more of the other contacts such that electrical components are connected and disconnected in a desired manner as the switch is actuated.

In some embodiments, the main contact of one unit may be offset from the main contact of another unit in the multi-pole test block. In some such embodiments, this offset clocking may be configured such that a relay connector of a first electrical test switch is not disconnected from a field connector of the first electrical test switch simultaneously with a relay connector of a second electrical test switch being disconnected from a field connector of the second electrical test switch. This may allow for a relay connector of a first electrical test switch to be disconnected from a field connector of the first electrical test switch before a relay connector of a second test block is disconnected from a field connector of the second electrical test switch (assuming the units are stacked together in such a way that actuation of a switch lever of one of the units results in simultaneous actuation of one or more other switch levers).

Of course, this concept may be applied to other embodiments described herein as well. For example, in test block 200, electrical test switch 201B may comprise a main contact that extends around an angle on the substantially circular track that is distinct from the angle about which the main contact of the adjacent electrical test switch 201A extends about its corresponding substantially circular track. Alternatively, or additionally, one or more other contacts, such as test port contact 234, may also extend around an angle that is distinct from one or more other such contacts in the multi-pole test block. Extending around a distinct angle may comprise extending about a larger angle that may wholly encompass the corresponding angle of an adjacent contact (in other words, the contact of one unit may simply be larger than one or more other contact). Alternatively, extending around a distinct angle may comprise use of contacts that are the same size as one another, but which are rotated by a desired angle with respect to one another.

FIGS. 10A and 10B depict test switch 300 in a testing configuration. In this configuration, relay connector 324 has made contact with test port contact 334 and, thus, test port 320 is electrically coupled to the relay. The configuration depicted in FIGS. 10A and 10B therefore is suitable for commissioning, troubleshooting, maintenance, and testing, for example, via test port 320.

It will be understood by those having skill in the art that many changes may be made to the details of the above-described embodiments without departing from the underlying principles of the invention. For example, any suitable combination of various embodiments disclosed herein, or the features, elements, or components thereof, is contemplated, irrespective of whether such features, elements, or components are explicitly disclosed as being part of a single exemplary embodiment.

It should also be understood that terms such as "right," "left," "top," "bottom," "above," and "side," as used herein, are merely for ease of description and refer to the orientation of the components as shown in the figures. It should be understood that any orientation of the components described herein is within the scope of the present disclosure.

Throughout this specification, any reference to "one embodiment," "an embodiment," or "the embodiment" means that a particular feature, structure, or characteristic described in connection with that embodiment is included in at least one embodiment. Thus, the quoted phrases, or variations thereof, as recited throughout this specification are not necessarily all referring to the same embodiment.

Similarly, it should be appreciated that in the above description of embodiments, various features are sometimes grouped together in a single embodiment, figure, or description thereof for the purpose of streamlining the disclosure. This method of disclosure, however, is not to be interpreted as reflecting an intention that any claim require more features than those expressly recited in that claim. Rather, inventive aspects lie in a combination of fewer than all features of any single foregoing disclosed embodiment.

A variety of modifications in and to the embodiments and implementations disclosed herein will be apparent to those persons skilled in the art. Accordingly, no limitation on the invention is intended by way of the foregoing description and accompanying drawings, except as set forth in the appended claims.

The invention claimed is:

1. A test switch, comprising:
  a switch lever;
  a test port configured to directly couple to a standard connector;
  a relay port;
  a field port; and
  an insulated frame configured to electrically insulate at least some electrically conductive portions of the test port, the relay port, and the field port from contact by a user;
  wherein actuation of the switch lever reconfigures the electrical test switch from a first configuration in which the test port contact is electrically isolated from the relay port and the field port is electrically connected to the relay port to a second configuration in which the test port contact is electrically connected to the relay port and the relay port is electrically isolated from the field port.

2. The test switch of claim 1, further comprising:
  a relay connector electrically connected with the relay port;
  a field connector electrically connected with the field port; and
  the main contact, configured to electrically connect the relay connector and the field connector in the first configuration.

3. The test switch of claim 2, wherein the main contact is electrically isolated from the test port contact.

4. The test switch of claim 3, wherein the relay connector comprises a plurality of fingers that are configured to facilitate engagement with the test port contact in the second configuration and to facilitate engagement with the main contact in the first configuration.

5. The test switch of claim 3, wherein the switch lever is configured to simultaneously move the main contact and the test port contact.

6. The test switch of claim 5, wherein the switch lever is connected with a substantially circular track, and wherein the substantially circular track comprises the main contact and the test port contact, such that the main contact and the test port contact rotate together about the substantially circular track when the switch lever is actuated.

7. The test switch of claim 6, wherein the insulated frame comprises a rotor, wherein at least a portion of the rotor defines the substantially circular track.

8. The test switch of claim 1, further comprising a shorting connector, wherein the shorting connector is electrically isolated from the field port in the first configuration.

9. The test switch of claim 8, wherein actuation of the switch lever further reconfigures the electrical test block to a third configuration in which the shorting connector is electrically connected to the field port and the test port contact is electrically isolated from the relay port.

10. The test switch of claim 9, wherein the switch lever is configured to transition to the third configuration in between the first and second configurations.

11. The test switch of claim 10, wherein the switch lever is configured such that the third configuration is reached at substantially the midpoint of the position of the switch lever between the first configuration and the second configuration.

12. The test switch of claim 1, wherein the test port contact is recessed within the test switch in the second configuration.

13. The test switch of claim 1, wherein a user-facing side of the test switch is free of electrically conductive components in the first configuration.

14. The test switch of claim 1, wherein the test switch is stackable such that the test switch can be connected with other electrical test blocks in a stacked configuration.

15. The test switch of claim 14, wherein the test switch further comprises one or more locking features configured to facilitate stacking of a plurality of test switches in a stacked configuration in order to form a test block.

16. The test switch of claim 15, wherein the one or more locking features comprises one or more openings formed within the frame, wherein the one or more openings are configured to receive a connecting rod therethrough to stack the plurality of test switches in a stacked configuration.

17. An electrical test block, comprising:
a first modular test block, comprising:
a frame;
a test port connected with the frame;
a test port contact electrically connected with the test port;
a main contact, wherein the main contact is electrically insulated from the test port contact;
a relay connector;
a field connector; and
a switch lever, wherein the switch lever is configured to reconfigured the electrical test block from a first configuration in which the test port contact is electrically insulated from the relay connector and the field connector is electrically connected to the relay connector to a second configuration in which the test port contact is electrically connected to the relay connector and the relay connector is electrically insulated from the field connector, wherein the main contact is used to electrically connect the relay connector and the field connector in the first configuration; and
a second modular test block connected with the first modular test block, comprising:
a frame;
a test port connected with the frame;
a test port contact electrically connected with the test port;
a main contact, wherein the main contact is electrically insulated from the test port contact;
a relay connector; and
a field connector, wherein the second electrical test block is configured for connection with the first electrical test block such that actuation of the switch lever causes the second modular test block to actuate with the first modular test block.

18. The electrical test block of claim 17, wherein the main contact of the second modular test block is offset from the main contact of the first modular test block such that the relay connector of the first modular test block is not disconnected from the field connector of the first modular test block simultaneously with the relay connector of the second modular test block being disconnected from the field connector of the second modular test block.

19. The electrical test block of claim 17, wherein the test ports of the first and second modular test blocks are configured to connect with banana plugs without an intermediary connector device positioned between the test ports and the banana plugs.

20. The electrical test block of claim 17, wherein the electrical test block is configured with a dead front in the first configuration such that the test ports of the first and second modular test blocks are not physically accessible in the first configuration.

\* \* \* \* \*